United States Patent [19]
Xi et al.

[11] Patent Number: 5,274,249
[45] Date of Patent: Dec. 28, 1993

[54] SUPERCONDUCTING FIELD EFFECT DEVICES WITH THIN CHANNEL LAYER

[75] Inventors: Xiaoxing Xi, Greenbelt, Md.; Chris Doughty; Thirumalai Venkatesan, both of Washington, D.C.

[73] Assignee: University of Maryland, College Park, Md.

[21] Appl. No.: 810,876

[22] Filed: Dec. 20, 1991

[51] Int. Cl.$^5$ ............ H01L 39/22; H01B 12/00; B05D 5/12
[52] U.S. Cl. ............................. 257/39; 257/33; 505/1; 505/702; 427/62
[58] Field of Search ............ 505/1, 701, 702; 357/5, 357/23.7; 257/33, 39

[56] References Cited

U.S. PATENT DOCUMENTS

| | | | |
|---|---|---|---|
| 4,489,478 | 12/1984 | Sakuri | 357/23.7 |
| 4,692,994 | 9/1987 | Moniwa et al. | 357/23.7 |
| 4,692,994 | 9/1987 | Moniwa et al. | |
| 4,843,446 | 6/1989 | Nishino et al. | 357/5 |
| 5,019,551 | 5/1991 | Hidaka | 505/1 |
| 5,034,374 | 7/1991 | Awaji et al. | 505/1 |
| 5,041,188 | 8/1991 | Myrosznyk et al. | 156/634 |
| 5,047,390 | 9/1991 | Higashino et al. | 505/1 |
| 5,049,543 | 9/1991 | Van Der Kolk et al. | 505/1 |
| 5,061,971 | 10/1991 | Takemura | |
| 5,071,832 | 12/1991 | Iwamatsu | 357/5 |

FOREIGN PATENT DOCUMENTS

| | | | |
|---|---|---|---|
| 0280308 | 8/1988 | European Pat. Off. | 357/5 |
| 306896 | 3/1989 | European Pat. Off. | |
| 324044 | 7/1989 | European Pat. Off. | 357/5 |
| 390704 | 10/1990 | European Pat. Off. | 357/5 |
| 63-241824 | 10/1988 | Japan | 505/702 |
| 1-011379 | 1/1989 | Japan | 505/1 |
| 1-017420 | 1/1989 | Japan | 505/1 |
| 64-19616 | 1/1989 | Japan | |
| 64-24476 | 1/1989 | Japan | 357/5 |
| 64-72413 | 3/1989 | Japan | |
| 1-100812 | 4/1989 | Japan | 505/1 |
| 1-24476 | 6/1989 | Japan | |

(List continued on next page.)

OTHER PUBLICATIONS

Adachi et al, "Dielectric Properties of PLZT Epitaxial Thin Films", Japanese J. Appl. Phys. vol. 22, Supp. 22-2 1983, pp. 11-13.

Rogers et al, "Fabrication of Heteroepitaxial YBaCuO-PrBaCuO-YBaCuO Josephson Devices Grown by Laser Deposition", Appl. Phys. Lett., vol. 55, #19, 6 Nov. 1989, pp. 2032-2034.

Jia et al, "Sputter Deposition of YBaCuO Films on Si at 500° C. with Conducting Metallic Oxide as a Buffer Layer", Appl. Phys. Lett., vol. 57, #3, 16 Jul. 1990, pp. 304-306.

Ramesh et al, "Ferroelectric Bismuth Titanate/Superconducting (YBaCuO) Thin-Film Heterostructures on Silicon", Appl. Phys. Lett., vol. 59, #14, Sep. 1991, pp. 1782-1784.

Power Electronics, Chapter 4, pp. 1-33, C. H. Nowlin, Oak Ridge National Laboratory.

(List continued on next page.)

*Primary Examiner*—Rolf Hille
*Assistant Examiner*—Mahshid Saadat
*Attorney, Agent, or Firm*—Oblon, Spivak, McClelland, Maier & Neustadt

[57] ABSTRACT

A superconducting field effect device includes a substrate with an epitaxial superconducting film upon it and an insulating layer above a thinner region of the film which protects the film from the atmosphere and isolates it from a gate electrode which is on the insulating layer above a channel region of the thin film, and the epitaxial film has thicker regions suitable for contact to source and drain electrodes. Gate electrodes may be isolated from and oppose both sides of the superconducting thin regions so that enhanced modulation of a current in the thin region is provided.

The invention provides high speed and high efficiency switches and modulators.

50 Claims, 14 Drawing Sheets

FOREIGN PATENT DOCUMENTS

| | | | |
|---|---|---|---|
| 2391 | 1/1990 | Japan | 357/5 |
| 237786 | 2/1990 | Japan | 357/5 |
| 2-87688 | 3/1990 | Japan . | |
| 2-94678 | 4/1990 | Japan | 357/5 |
| 2-186682 | 7/1990 | Japan | 357/5 |
| 2-191382 | 7/1990 | Japan . | |
| 2-264485 | 10/1990 | Japan | 505/1 |
| 8903126 | 4/1989 | World Int. Prop. O. | 505/1 |
| 8906441 | 7/1989 | World Int. Prop. O. | 505/1 |

OTHER PUBLICATIONS

"High Performance Silver Ohmic Contacts to $YBa_2Cu_3O_{6+x}$ Superconductors", Appl. Physics Lett., vol. 52, No. 2, Jan. 11, 1988, Y. Tzeng et al, pp. 155–156.

"Plasma Polymerization for High $T_c$ Oxide Superconductors", Appl. Phys. Lett., vol. 52, No. 22, May 30, 1988, S. Morohashi et al pp. 1897–1898.

"A Novel Metal Matrix High $T_c$ Superconducting Composite", Dept. of Physics, Ohio State Univ., J. C. Garland et al, pp. 319–320.

"Superconductors Material Problems", Science, vol. 240, Apr. 1988, pp. 25–27.

"Low–Resistivity Contacts to Bulk High $T_c$ Superconductors", Appl. Phys. Lett., vol. 54, No. 25, Jun. 19, 1989, S. Jin et al, pp. 2605–2607.

"High $T_c$ Superconductor/Noble–Metal Contacts With Surface Resistivities in the $10^{-10}$ $\Omega cm^2$ Range", Appl. Phys. Lett., vol. 52, No. 21 May 23, 1988, J. W. Ekin et al, pp. 1819–1821.

"Preparation of Thin Film High Temperature Superconductors", Preprint for pres. at Appl. Superconductivity Conf. Sep. 24–28, 1990 and publication in IEEE Transactions on Magnetics, Mar. 1991, X.X. Xi et al, entire document.

"Dielectric Properties of $SrTiO_3$ Thin Films Used in High-$T_c$ Superconducting Field-Effect Devices", Dept. of Phys., Univ. of Maryland, A. Walkenhorst et al, entire document.

"Preparation and Superconducting Properties of Ultrathin $YBa_2Cu_3O_{7-x}$ Films", Appl. Phys. Lett., vol. 54, No. 23, Jun. 5, 1989, X. X. Xi et al, pp. 2367–2369.

"Direct Hole Density Modulation and its Effects on Normal State Transport and Superconductivity in $YBa_2Cu_3O_{7-x}$", Dept. of Physics Univ. of Maryland, entire document.

Applied physics letter, vol. 57, No. 3, 16 Jul. 1990, pp. 304–306, Q. X. Jia et al.: "Sputter Deposition of YBaCuO Films on Si at 500° C. With Conducting Metallic oxide as a buffer layer," see abstract and pp. 304–306.

Applied physics letter, vol. 555, No. 19, 6 Nov. 1989, C. T. Rogers et al.: "Josephson devices grown by laser deposition," pp. 2032–2034, see pp. 2032–2034.

Applied physics letter, vol. 59, No. 14, 30 Sep. 1991 R. Ramesh et al.: "Ferroelectric bismuth titanate/superconducting (YBaCuO) Thin–film heterostructures on silicon": See whole article.

Proceeding of the 4th Meeting on Ferroelectric Materials and their applications, Japanese Journal of Applied Physics, vol. 22, Supp. 22-2, H. Adachi et al.: 1983 "Dielectric properties of PLZT Epitaxial Thin Films," pp. 11–13, See whole document.

2nd Workshop on High-Temperature Superconductor Electron Devices, R&D Association for Future Electron Devices 7-9, Jun. 1989, M. Furuyama et al.: "In-Situ Growth of YBaCuO thin films by Reactive co-evaporation technique", pp. 105–108, See whole document.

"In-Situ Growth of YBaCu3O7-X Thin Films by Reactive Co-Evaporation Technique" 2nd Workshop on High Temperature Superconducting Electron Devices R&D Association for Future Electron Devices Jun. 7-1, 1989 in Shikabe, Hokkaido, Japan, pp. 105–108.

1021

1122

1223

2021

○ Tl OR Bi
○ Ca
⊜ Ba OR Sr
• Cu
• O

2122

2223

SUPERCONDUCTING FIELD EFFECT DEVICES WITH THIN CHANNEL LAYER

BACKGROUND OF THE INVENTION

1. Field of the Invention

This invention relates generally to electric devices. In particular, this invention relates to electric devices using superconducting materials. More particularly, this invention relates to a structure for a modulation device which uses superconducting materials as the active material.

2. Discussion of the Background

Metallic superconductors have been known since 1911. A physical description of this phenomena evolved throughout this century, including the London equations, the concepts of superconducting paired electrons for electrons near the Fermi surface of a metal, and the subsequent Bardeen Cooper Schrieffer (BCS) theory. A discussion of these theories and characterizations can be found in "INTRODUCTION TO SUPERCONDUCTIVITY", Robert E. Krieger Publishing Company, Malabra, Fla., by Michael Tinkham (Card Catalog number QC612.S8T49).

A more applied description of superconductivity as it relates to electronics is present in the book "ENERGY APPLICATIONS OF HIGH TEMPERATURE SUPERCONDUCTORS", Vol. 2, edited by S. J. Dale, S. M. Wolf and T. R. Schneider and published by Research Reports Center, Palo Alto Calif., and in Chapter 4 thereof, by C. H. Nowlin, Oak Ridge National Laboratory, which describes applications of superconductivity to power electronics which also includes a discussion of electric field switching of a superconducting thin film.

Chapter 4, by Nowlin et. al., indicates that superconducting field effect switches may have a reduced power loss than currently available switches and that electric motors and generators using superconducting switches would be considerably more efficient. A capacitor structure is described therein consisting of a metal-insulator-superconductor layer. Voltage applied to the metal electrode induces an electric field between the metal and superconducting electrodes.

The electric field induces a surface charge in a thin surface region of the superconducting layer and affects the total conduction charge in the superconducting layer. Thickness of the induced charge layer in the superconductor is proportional to $n^{-1/6}$ where n is the carrier charge density. The induced charge only penetrates a few angstroms into the superconducting material. For $n = 5 \times 10^{21}/cm^3$, as in $YBa_2Cu_3O_7$ the induced charge extends about 5 angstroms, while for Cu the induced charge only penetrates about an angstrom. $YBa_2Cu_3O_7$ has a perovskite type structure of the form $ABO_3$ where Y and Ba are on the A sites, Cu is on the B sites, Oxygen is on the O sites, and some of the O sites are unoccupied.

The article "EXPERIMENTAL CONSIDERATIONS IN THE QUEST FOR A THIN FILM SUPERCONDUCTING FIELD-EFFECT TRANSISTOR", A. F. Hebard et. al., IEEE Transactions on Magnetics MAG-23 1279-1282, 1987, discusses results of electric field switching of superconducting layer of indium and indium oxide, a low superconducting transition temperature ($T_c$) material with a $T_c$ of about 1 degree Kelvin, on a 1 micron thick ceramic dielectric layer. Only a fivefold modulation of the resistance of the switched layer was obtained. The transition temperature of these superconductors is low, around 1.0 degree Kelvin.

The article "FIELD EFFECT ON SUPERCONDUCTING SURFACE LAYERS OF $SRTIO_3$", Extended Abstracts, Superconducting Materials, Proceedings of Symposium S, 1986, Fall Meeting of the Materials Research Society, pp. 47-49, discusses work on Ta doped $SrTiO_3$ and $Ba_xSr_{1-x}TiO_3$ in which complete modulation of carrier concentration of these thin films was achieved. The carrier concentrations of these films is as low as $1.0 \times 10^{20}$ carriers/$cm^3$. Unfortunately, the superconducting transition temperature of these materials is also only about 1 degree Kelvin.

Recently, superconductivity in $YBa_2Cu_3O_7$ was discovered. The high superconducting transition temperature of this material spurred work on related materials, leading to discovery of several structural families of metal-oxide superconductors whose properties are now well known. Each structural family is characterized by a crystal structure and in each family variations in physical properties, including superconducting properties, due to variation in composition of sublattices for the metal ions are well known. For example, in the '123" structure for $YBa_2Cu_3O_{7-x}$ in which x can vary between 0 and 1, superconductivity occurs when x is less than 0.6. Also, Y can be replaced by most of the other rare earths, including Nd, Gd, Sm and La without affecting the superconducting transition temperature, which is around 90 degrees Kelvin. Composition variations for the superconducting compounds having the structures of the following compounds: $Tl_2Ba_2Ca_2Cu_3O_{10}$, $Tl_2BA_2Ca_1Cu_2O_8$, $Tl_2Ba_2Cu_1O_6$, (TBCCO or TlBaCaCuO compounds) and the related Bi-Sr-Ca-Cu-0 and Bi-Sr-Cu-0 compounds (also called BSCCO or BiSrCaCuO compounds), the $La_2CuO_4$ structure compounds (also known as 214 compounds and LaCuO compounds), the Ba-K-Bi-O (BKBO or BaKBiO) and Ba-Pb-Bi-0 (BPBO or BaPbBiO) structure compounds, are well known. $Ba_xK_{1-x}BiO_3$ which is superconducting and has the perovskite structure is well known.

These metal oxide superconductors are well suited in comparison with other superconductors such as Pb and Nb for use as active materials in field effect devices for several reasons. Pb and Nb have carrier concentrations of roughly $10^{23}/cm^3$ so their screening length for induced surface charge is about 1 angstrom. Application of an electric field to a surface of a metal-oxide superconductor only modulates the charge density in the superconductor within a couple screening lengths of the surface. Since the free carrier charge density is on the order of $10^{21}$ carriers/$cm^3$, the screening length is very short, only a few angstroms. The metal-oxide superconductors react with atmosphere to form nonsuperconducting surface layers.

The coherence length of superconductors decreases with increasing superconducting transition temperature. For materials having high superconducting transition temperatures, such as many of the metal-oxide superconductors, the coherence length of superconducting pairs is only 5 to 10 angstroms. When these pairs encounter a disordered area which is as large as their coherence length they tend to scatter and become unpaired. Therefore crystal imperfections, such as grain boundaries, drastically reduce the critical current in high superconducting transition temperature metal-oxide materials.

Thin films of many metal-oxide superconductors have been grown. However, these films have not exhibited stable electrical properties. The electrical characteristics of these films deteriorate rapidly with time. Also, for an electrically continuous thin film, a smooth substrate is necessary.

Some thin epitaxial films of metal-oxide superconductors have been deposited on single crystal substrates such as $SrTiO_3$ and related perovskite materials. For very thin films to be electrically continuous, these substrates must also be very smooth. Various metal-oxide superconductor thin films on various substrates are described in the article in *IEEE Transactions in Magnetics*, 27, 2 (1991). In particular, this article describes thin film properties of thin films of $YBa_2Cu_3O_7$ (YBCO), Bi-Sr-Ca-Cu-O (BSCCO), Tl-Ba-Ca-Cu-0 (TSCCO) compounds including $Bi_2(SrCa)_3Cu_2O_x$, and surfaces and interfaces for Nd-Ce-Cu-0. This article also discusses multilayers of YBCO/insulator, YBCO/PBCO (PBCO is $PrBa_2Cu_3O_7$, YBCO/MgO/YBCO, YBCO/$Y_2BaCuO_5$, superconductor/insulator/superconductor structures and $LaAlO_3$/YBCO multilayers. The article in the *Journal of Materials Research*, published by the Materials Research Society, Pittsburg Pa., contains information in many articles on the properties of high temperature superconductor, ferroelectric, piezoelectric and insulator thin films. The book "COPPER OXIDE SUPERCONDUCTORS", by C. P. Poole, T. Datta, H. A. Farach, published by Wiley (1988) discloses different structural types and chemically equivalent substitutions in these structures which do not affect superconduction for $CuO_x$ superconductors. Chapter 4 of this book discloses thin film properties and Chapter 6 discloses crystallographic structure types, including the $La_{2-x}M_xCuO_{4-y}$ "214" structure and the $RBa_2Cu_3O_{7-z}$ "123" structure.

FIG. 19 shows a unit cell of the undistorted (cubic) perovskite structure, $ABO_3$. The body centered atom 100, corresponds to A in the chemical formula, the edge centered atoms 101 correspond to the B atom in the chemical formula and the corner elements 102 correspond to the O atoms in the chemical formula. In the metal-oxide compounds O is oxygen.

FIG. 20 shows the $La_2CuO_4$ structure. Oxygen is represented by the large open circles 104, La by the circles containing crosses 103, and Cu by small darkened circles 105. The crystallographic directions are indicated by the a, b and c axes.

FIG. 21 shows the YBCO structure. The large open circles 106 represent the body centered positions, containing Y and Ba and are labelled as such. The small dark circles 107 represent Cu atoms and the small open circles 108 represent oxygen atoms. The a, b, and c crystallographic directions are labelled.

FIG. 22 shows the various related layered structures of the BSCCO and TBCCO compounds. The numerals below each structure refer to the chemical formula of the compounds and the number of layers associated with each metallic element in the chemical formula. For example the 1122 structure corresponds to BiSr $Ca_2Cu_2$ oxide and to $TlBaCa_2Cu_2$ oxide. In FIG. 22 the large open circles represent Tl or Ba, the small open circles represent Ca, The cross-hatched circles represent Ba or Sr, the large dark circles represent Cu, and the small dark circles represent oxygen. These structures are illustrated in *Solid State Physics-Superconductivity, Quasicrystals, TwoDimensional Phsyics*, Vol. 42, Academic Press Pub., edited by H. Ehrenreich and D. Turnbull, page 135 to 211, San Diego.

FIG. 23 shows a diagram of one example of the lattice matching in an epitaxial structure in which a Si (100) surface is epitaxially contacted to yttria stabilized zirconia (YSZ) and the upper surface of the YSZ is epitaxially connected to the a-b plane of YBCO.

Several recent U.S. patents relating to oxide-superconductors are of interest and are hereby incorporated by reference; U.S. Pat. Nos. 5,034,374, 5,041,188, 5,019,551, 5,047,390 and 5,049,543.

Up until the present time field modulation of electrical properties of metal-oxide superconductors has not been practical due to the very thin films required and the problems with fabrication and compatibility of the materials involved in such structures.

SUMMARY OF THE INVENTION

Accordingly, one object of the invention is to provide an improved field effect device.

Another object of the invention is to provide a low loss superconducting field effect device.

Another object of the invention is to provide a high speed field effect device.

Another object is to provide a field effect device whose electrical properties do not deteriorate with time.

Another object of the present invention is to provide a novel structure for modulating electrical properties of a superconducting material using an electric field.

Another object of this invention is to provide a novel structure for modulating electrical properties of a thin film of a superconducting material using an electric field.

Another object of this invention is to provide a novel structure for protecting a thin film of a superconducting material in which the thin film may be modulated by an electric field.

Another object of this invention is to provide a novel structure for protecting an epitaxial thin film of a superconducting material in which the thin film may be modulate by an electric field.

Another object of this invention is to provide a novel structure for modulating electrical properties in a series of thin films of superconducting material that are stacked or overlapping.

These and other objects of the invention can be obtained by providing a substrate, and a film of a superconducting material above the substrate and having a lower surface epitaxially matched thereto, in which the film has a thinner region and a thicker region, a thickness of the thin region is less than 20 times the coherence length of a bulk material at zero temperature which consists of the same material as the superconducting film.

These and other objects of the invention may also be obtained by providing an interleaved structure comprising a first unit including a thin film of a superconducting material with an upper and a lower surface which forms a channel layer; an upper surface of a lower insulating gate layer epitaxially connected to the lower surface of the superconducting film and a lower surface of an upper insulating gate layer epitaxially connected to the upper surface of the superconducting film; a lower gate electrode below the lower insulating gate layer; and an upper gate electrode above the upper insulating gate layer.

Another object of this invention is to provide novel processes for fabricating a structures for modulating electrical properties of a superconducting material using an electric field.

Fabrication of a structure of the invention can be accomplished by epitaxially depositing a thin layer of a superconducting material onto a surface, and shadow masking a portion of the surface while epitaxially depositing a thick layer of a superconducting material onto unmasked portions of said thin layer, so that a thin layer region remains under the masked portion.

Fabrication of a structure according to the invention can also be accomplished by shadow masking a portion of a surface while epitaxially depositing a thick layer of a superconducting material on unmasked portions of the surface, and epitaxially depositing a thin film of a superconducting material simultaneously on said surface and said thick layer to form a thin layer region so that a thin layer region is formed in the region which had been shadow masked.

Fabrication of a structure according to the invention can also be accomplished by epitaxially depositing a channel layer of superconducting material above a substrate; and depositing gate electrodes above and below the superconducting material.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
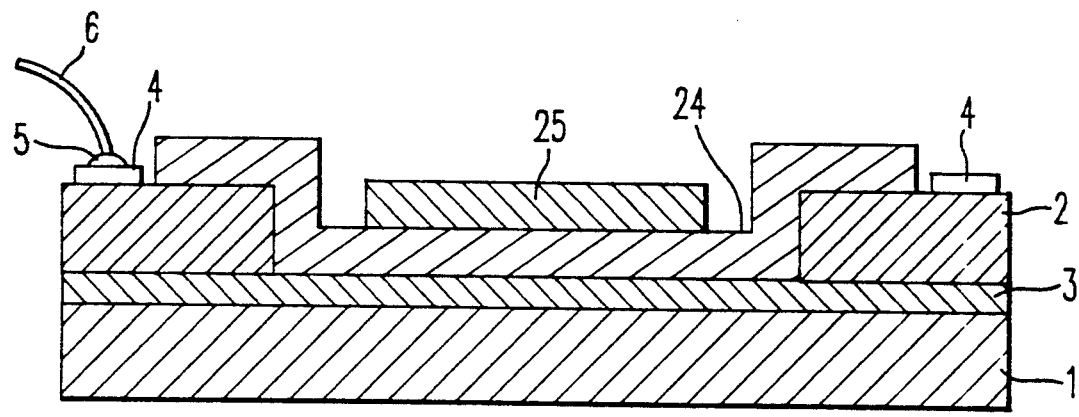
FIG. 1 is a side view of a single channel layer device based upon a preferred embodiment of the invention.

Refer now to the drawings, wherein like reference numerals designate identical or corresponding parts throughout the several views, and more particularly to FIG. 1 thereof, which shows a side view of a preferred embodiment of the invention. A substrate 1 has above it a film of a superconducting material which has thicker regions 2 and thinner region 3. Regions 2 and 3 are shaded differently in order to distinguish them. A lower surface of the superconducting film is epitaxially connected with the substrate.

In the context of the following description, epitaxially connected to a surface is defined to mean either epitaxial with and in direct contact with a surface or connected through one or more intervening layers to a surface when the intervening layers are each epitaxial with one another and with the surface.

An insulating gate layer 24 covers the thinner region 3 and part of the thick region 2. A gate electrode 25 covers part of the upper surface of the insulating gate 24. Contact pads 4 on exposed surfaces of the thick regions 2 of the superconducting layer are connected to lead wires 6 at junctions 5. The material of the insulating gate layer 24 may be epitaxially connected to the top surface of the thinner region 3. Thinner region 3 forms a conducting channel between the contact pads 4 and application of an electric field to the upper surface of the channel by application of a voltage to gate electrode 25 modulates the real and imaginary parts of the impedance of the channel. The $T_c$, normal and superconducting portions of the conductivity and kinetic inductance all depend upon carrier concentration and therefore can be modulated by biasing gate electrode 25. In the BCS theory, $T_c$ is proportional to $e^{1/N(0)V}$ where $N(0)$ is the density of states at the fermi level and V is the coupling strength. The normal state portion of the conductivity is proportional to $ne^2T/M$ where n is carrier density, e is unit charge, T is electron mean scattering time and M is electron effective mass. Kinetic inductance is proportional to $M/ne^2$.

Several materials are suitable for the insulating gate 24. These include $SrTiO_3$, $MgO$, $BaTiO_3$, $LaAlO_3$, $NdGaO_3$, and $CeO_2$, among others. Generally any material which is insulating is acceptable, and materials which are insulating and can be epitaxially connected to the superconducting channel of thin region 3 are preferred. A high dielectric constant material is preferred for the insulating gate 24 for reasons discussed below.

The insulating gate layer 24 may be a ferroelectric material such as lead lanthanum zirconium titanate (PLZT) or lead zirconium titanate (PZT) or lead barium strontium titanate $(PbBaSr)TiO_3$. A ferroelectric material can be switched so that a large polarization dielectric charge is present at a polarized surface thereof. Presence of this surface charge at the channel-ferroelectric interface induces screening charge at the channel layer surface. Since the ferroelectric state is hysteretic, a polarized ferroelectric remains polarized when gate electrode 25 is deenergized. Therefore, the modulation of the resistance of the channel layer, thinner region 24, remains after the gate electrode 25 is deenergized. The switching state of a ferroelectric gate device can therefore be latched to a particular state. This type of device can be used as nonvolatile memory unit. The insulating gate 24 may also be a pyroelectric material which can form a dielectric polarization surface charge by heating or cooling.

The insulating gate layer 24 may also comprise a piezoelectric material. A strain in the piezoelectric layer will induce a bulk polarization of the piezoelectric layer and also a related surface charge at the interface with the thinner region 3. The induced surface charge modulates the carrier density in the thinner region 3 in the same way as discussed above.

In a preferred embodiment corresponding to the structure of FIG. 1, the substrate 1 is $SrTiO_3$ (100), the superconducting film comprising regions 2 and 3 is $YBa_2Cu_3O_7$ with its A-B axis plane parallel to the surface of the substrate, the thinner region 3 is less than 50 angstroms thick, the thick regions 2 are greater than 300 angstroms thick, the insulating gate 24 is also $SrTiO_3$ and is also epitaxial with the superconducting thin film of thinner region 3.

The thicker regions 2 of the superconducting thin films must be thick enough so that these regions do not degrade with time and are also thick enough so that contacts can be made to them.

The inventors have noted that films which are less than 50 angstroms thick become nonsuperconducting after exposure to atmosphere for a period of less than a couple days. Thicker films have some surface layer, typically 50 to 100 angstroms thick, which is not superconducting, probably for the same reasons. The thinner regions 3 of this invention remain superconducting.

The stable ohmic contacts between contact pads 4 and thicker regions 2 may be formed when the contact pad comprises platinum, gold or silver thin films, silver paint or indium contacts and any metal lead wire will do. Other noble metals may also provide adequate ohmic contact to thicker regions 2. The thicker regions 2 provide natural low resistance connection to the thinner regions 3 of the superconducting film. In this manner there is no interfacial disturbance where the thinner regions 3 join to the thicker regions 2.

The thinner superconducting region 3 must be thin enough so that an electric field applied to a surface thereof can significantly modulate the carrier density in a cross section of the thinner region 3. An important factor in modulating the carrier density across the cross-sectional width of a channel is the amount of mobile charge that can be induced in the thinner region 3 by the gate electrode 25. This is dependent upon the gate voltage and the dielectric constant of the insulating gate 24. The gate voltage that can be applied has an upper limit due to the breakdown field of the dielectric of the insulating gate 24. The charge is determined by simple electrostatic equations for a parallel plate capacitor.

The induced charge is proportional to $e_0e_1V_G/T$ where $e_0$ is the dielectric constant of free space, $e_1$ is the relative dielectric constant $V_G$ is the applied gate voltage and T is the thickness of the insulating layer 24. Since the induced charge is proportional to the relative dielectric constant of the insulating layer, a large insulating layer dielectric constant is desirable. This point is discussed in the paper "ELECTRIC FIELD EFFECT IN YBCO THIN FILMS", By X. X. Xi et. al, to be published in Applied Physics Letters on Dec. 23, 1991. Applied Physics Letters is published by the American Physical Society, New York, N.Y.

Therefore it is preferable that the thinner region 24 of the superconducting film be less than 200 angstroms, and more preferably less than 100 angstroms, and more preferably less than 50 angstroms and even more preferably less than 25 angstroms. It is most preferable that the thin superconducting region be less than 10 angstroms.

The insulating gate 24 also serves to protect the thinner region 3 from exposure to atmosphere so that the thinner region 3 does not react and degrade with time. Preferable the insulating gate 24 is epitaxially connected to the thinner region 3 so that strain at the interface between the thinner region 3 and the insulating gate 24, which could cause degradation of the thinner region, is minimized. Epitaxial connection also ensures protection from the atmosphere. This feature is very important for the reasons discussed earlier regarding film degradation.

Another important length scale which affects the modulation in the thinner region 3 is the coherence length of the superconducting carriers. Any modulation in the superconducting properties due to an applied charge at the interface occurs over the coherence length scale. Therefore it is very improbable that a superconducting carrier more than 10 coherence lengths from the surface opposing gate electrode 25 will be affected in any way by charge induced by a voltage on the gate electrode. However, interactions become more probable for superconducting carriers nearer the gate electrode 25.

It is therefore preferable that the thinner region be less than 20 coherence lengths of the zero temperature coherence length of the superconducting material of the thinner region 3, and more preferably less than 15 coherence lengths, and more preferably less than 10 coherence lengths, and more preferably less than 5 coherence lengths and most preferably less than 3 coherence lengths.

Figure 2:
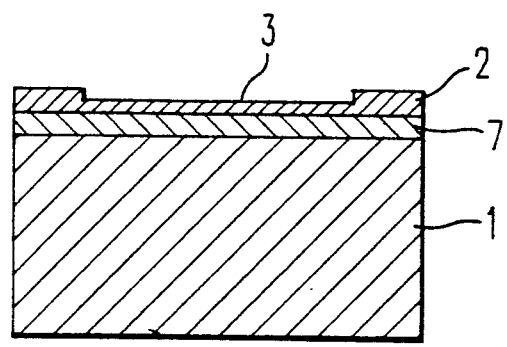
FIG. 2 is a side view of a another single channel layer embodiment of the invention.

FIG. 2 shows buffer layer 7 between the thinner region 3 and the substrate 1. The buffer layer 7 may provide a strain relief region or a better surface or a better lattice match upon which to grow the thinner region 3. The buffer layer 7 is epitaxially connected to the substrate 1 and to the thinner region 3.

For example, $PrBa_2Cu_3O_{7-x}$ provides a better lattice match to $YBa_2Cu_3O_{7-x}$ than a strontium titanate substrate so that a $PrBa_2Cu_3O_{7-x}$ buffer layer results in a more perfect (i.e. defect and strain free) thinner region 3. Since the superconducting properties of the thinner regions 3 are improved by crystal perfection, such buffers layers are beneficial.

Other perovskites, including $NdGaO_3$ may be used as the buffer layer 7. In addition, several other compounds, including $CeO_2$, and MgO may be used as buffer layers. Also, it is possible to dope perovskites in known ways to make them semiconducting. A semiconducting buffer layer would allow electrical contact to the thinner region 3 from its lower surface i.e. from the surface of the thinner region 3 closest to the substrate 1. Strontium titanate in particular can be doped semiconducting, for instance by use of Ta.

Other substrates may be used, for instance, Si and GaAs. Also the substrate 1 may be doped so that it is semiconducting.

Other metal-oxide superconductors may be used instead of $YBa_2Cu_3O_{7-x}$. For instance, metal-oxides forming the $La_2CuO_4$, BiSrCaCuO, BiKCuO, and TlBaCaCuO families may be used. Also electron superconductors such as CeSrCuO compounds may be used. The a and b lattice parameters of many of the oxide superconductors are so close that the same substrates are good epitaxial matches to all of them. For the same reason the thinner and thicker regions 3 and 2 may be formed from different lattice matched metal-oxide superconductors.

Figure 3:
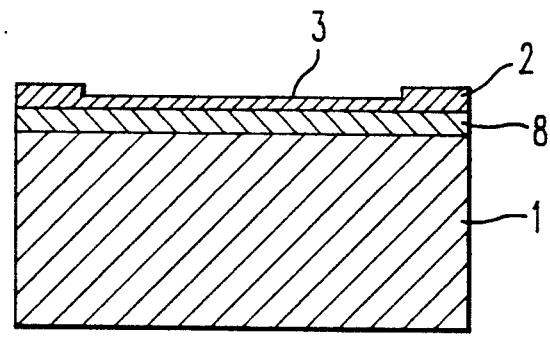
FIG. 3 is a side view of still another single channel layer embodiment of the invention.

FIG. 3 shows a structure in which a high mobility layer 8 is present between the substrate 1 and the thinner region 3. The high mobility layer provides carriers directly to the thinner region 3 when a bias voltage is applied to gate 25. In addition, if the high mobility layer is proximity coupled to the thinner superconducting region, a superconducting proximity region near the interface between the thinner region 3 and the high mobility layer 8, but in the high mobility layer 8 may be induced. The superconducting proximity region will have superconducting properties related to the properties of the high mobility layer. For instance the proximity region may have a much longer coherence length.

Figure 4:
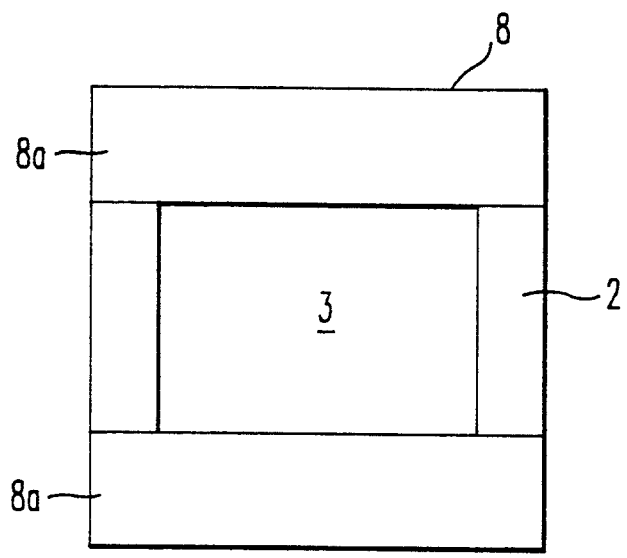
FIG. 4 is a plan view of the structure shown in FIG. 3.

FIG. 4 is a plan view of this structure. The high mobility layer 8 may be Si or GaAs or even doped $SrTiO_3$ or some other high mobility material. The high mobility allows charge in the high mobility layer to be rapidly applied to the superconducting surface. This increases the speed of the modulation of electrical properties of the superconducting layer. Preferably, the mobility of the high mobility layer 8 should be greater than 500 $cm^2/V$-sec, and more preferably greater than several thousand. The high mobility layer 8 may be electrically connected in the exposed regions thereof 8$a$ shown in the plan view of FIG. 4.

Figure 5:
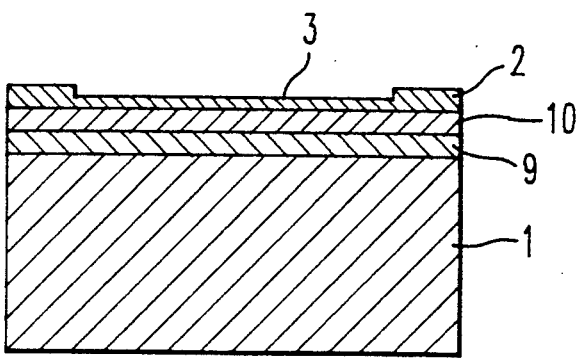
FIG. 5 is a side view of another single channel layer embodiment of the invention having two buffer layers.

FIG. 5 shows a structure in which two buffer layers, layers 9 and 10, are interposed between the epitaxially connected superconducting film 2, 3, and the substrate 1. Such a structure allows a buffer layer which is chemically and epitaxially compatible with a substrate to contact the substrate, and a buffer layer which is compatible with the material of the superconducting film to contact that film. This is particularly useful for epitaxial layers of metal-oxide superconductors on semiconducting substrates.

Buffer layers which might be particularly useful include $(LaSr)_2CuO_4$, yittria stabilized zirconia (YSZ), $RBa_2Cu_3O_7$ compound where R is a rare earth or Lanthanum, and $XYO_x$ where O is oxygen, X is at least one of Sr, Ba, Ca, Pb, Nd or another rare earth and Y is at least one of Ga, Al, Ti, Ta, Ge and Nb.

Operation of the device shown in FIG. 1 is as follows. A voltage is applied across the thicker regions 2, 2 by a voltage/current source (not shown) this induces a superconducting current in superconducting regions 2 and 3, when no voltage is present at gate electrode 25. When gate electrode 25 is biased to a voltage level, an electric field extends through insulating layer 24. Insulating layer 24 is electrically polarized by the field so that an induced charge is present at the surface of thinner region 3.

Charge is drawn through the superconducting regions 2 and 3 to counteract electric fields at the surface between the insulating layer and the thinner region 3. The screening charge, which tends to screen out electric field from the thinner region, extends into the thinner region 3 by about a screening length. The continuous presence of the charge changes the total number of charge carriers in the thinner region 3, and hence the number of these carriers in the superconducting state.

The superconducting charge carriers interact with the screening charge to modify the number of superconducting carriers in the thinner region 3.

The impedance of the thinner region 3 depends upon the number of superconducting carriers in the thinner region. Depending upon the sign of the bias of the gate electrode, the number of charge carriers in the thinner region 3 can be either decreased or increased. The properties of the channel may be affected as discussed above.

Because of the superconducting nature of the invention embodied in FIGS. 1-5, a very fast device is possible, and can be provided when the insulating layer between the gate electrode and conducting channel is very thin and when the conducting channel is also very thin. A further discussion of the interaction of these parameters and switching speeds is presented in the article "HIGH $T_c$ FIELD EFFECT TRANSISTOR-LIKE STRUCTURE MADE FROM YBCO ULTRATHIN FILMS", X. X. Xi et. al., to be published in Proceedings of the SPIE Conference on Progress in High-Temp. Superconducting Transistors and Other Devices, San Jose Calif. Results by the inventors of modulation of the hole density in a thin superconducting layer are reported in "DIRECT HOLE MODULATION AND ITS EFFECTS ON NORMAL STATE TRANSPORT AND SUPERCONDUCTIVITY IN $YBa_2Cu_3O_7$", by X. X. Xi et. al. submitted to Physical Review Letters which is published by the American Physical Society, New York, N.Y.

Figure 6:
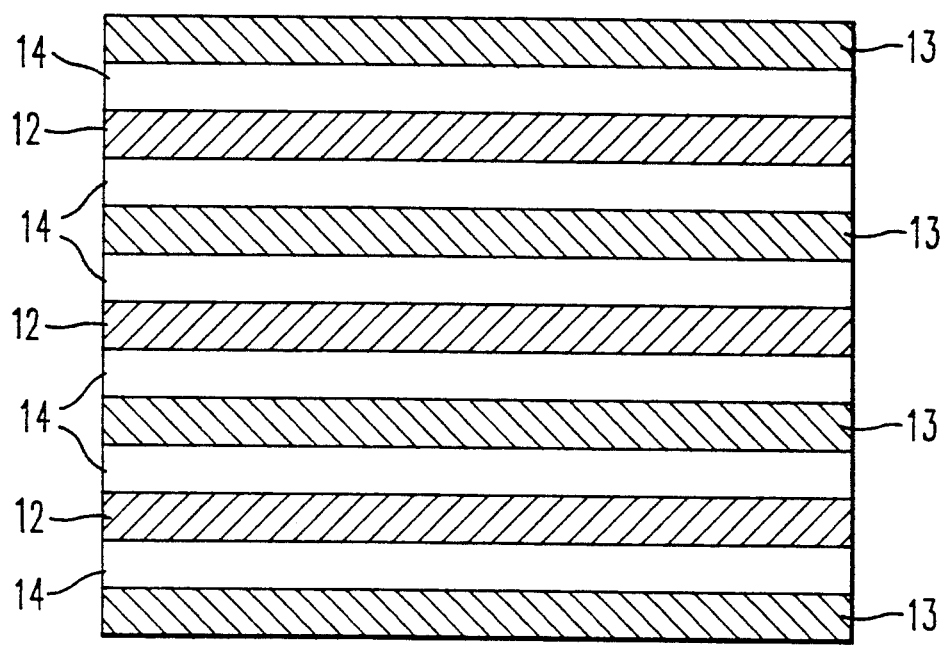
FIG. 6 is a side view of an embodiment having an interleaved gate insulator structure.

FIG. 6 shows an interleaved structure of the present invention. This structure has superconducting channel layers 12, gate electrode layers 13 and insulating layers 14 interleaved as shown. An important feature of this structure is that gate electrode layers 13 oppose both sides of a channel layer 12.

When voltage is applied to the gate electrode layers 13 on each side of a channel layer 12, charge forms on each surface of the channel layer 12. Therefore, twice as much charge is present in the channel layers 12 compared with a device which has only a single gate electrode opposing a single surface of a channel layer.

Also, the electric field penetrates from both sides of the superconducting channel layer so that less of the cross section of the channel is free of electric field and screening charge.

Another important feature of the structure shown in FIG. 6 is that the insulating layers 14 are epitaxially connected to a superconducting channel layer 12. This feature allows formation of high quality superconducting channel layers 12 which are thin enough to show useful field effect modulation of current transported therethrough. Also, encapsulation of the superconducting channel layers 12 prevents degradation of these layers by reaction with atmosphere, and epitaxial connection reduces strains at the surface of the channel layers 12.

The gate layers 13 may also be epitaxially connected to the channel layers 13 through the insulating layers 14. In this case the whole interleaved structure is epitaxially connected. The epitaxially connected structure reduces strain throughout and allows fabrication of high quality channel layers 13.

Figure 7:
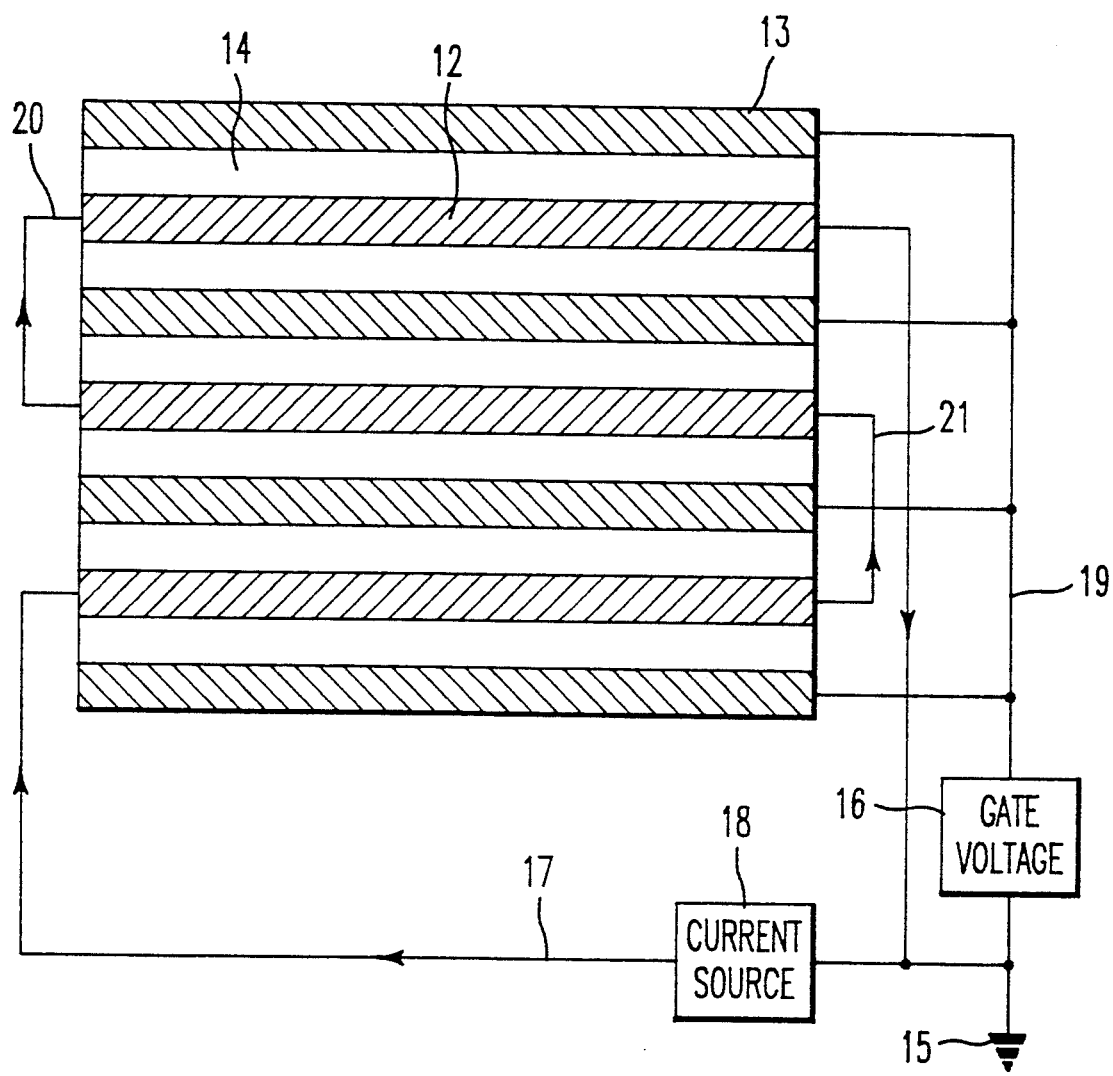
FIG. 7 is a side view of an interleaved gate structure with serial channel connection.

FIG. 7 shows connection of a system ground 15 and a current source 18 which supplies a current to the channel layers 12. The channel layers 12 are connected in series, as indicated by series connections 20 between channel layers 12. A gate voltage source 16 provides a gate voltage through gate voltage leads 19 to the gate electrodes 13. Epitaxially connected insulating layers 14 separate the gate electrode layers 13 from the channel layers 12.

Connection of several channel layers 12 in series on the other hand can provide a more complete modulation of the resistance of the channel conduction path so that much high current modulations can be obtained.

Figure 8:
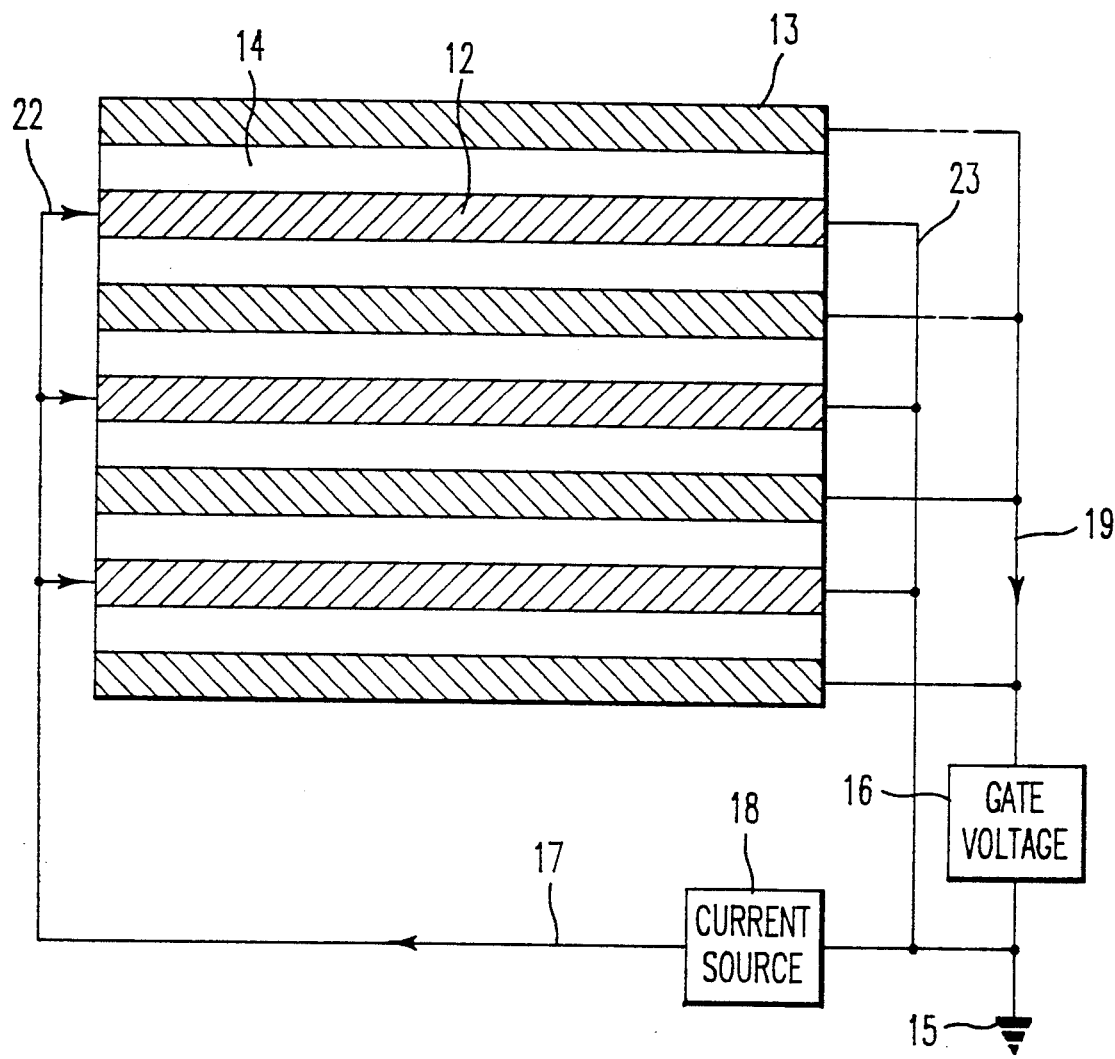
FIG. 8 is a side view of an interleaved structure with channels connected in parallel.

FIG. 8 shows channel layers 12 connected to the current source 18 through parallel connection 22 and 23. Connection of several channel layers 12 in parallel provides a much larger total cross sectional area for current transport. Therefore, when some of the channel layers 12 are connected in parallel higher current modulation devices are possible.

In a preferred embodiment of the interleaved structure the gate electrodes and the channels are $YBa_2Cu_3O_7$ and the insulating layers 14 are $SrTiO_3$. The channel layers are between 10 and 50 angstroms thick, the insulating layers are 500 angstroms thick and the gate electrodes are a couple thousand angstroms thick. The parallel or serial connections of the gate layers are provided by direct contact of extended portions of these layers with one another as shown in FIGS. 13-16 and discussed below.

The insulating layer thickness may be between 100 and 10,000 angstroms. The gate electrodes may be between 10 and a several thousand angstroms thick.

The channel layer is epitaxially connected with the insulating gate layers. In particular, the channel layer may consist of any of the metal-oxide superconductors. The insulating gate material may consist of any insulator which can be epitaxially connected to the channel layer. In particular, the insulating layer may consist of a perovskite ($ABO_3$ structure type) or structural variation thereof which provides a good lattice match to the structure of the channel layer.

Since the preferred current direction in many of the metal-oxide superconductors is the plane containing the a and b axes of the crystal structure, it is preferable to fabricate the channel epitaxial so that its a-b plane is parallel to the insulating gate surfaces. This is accomplished by preparing the insulating gate layer so that a surface which lattice matches the a-b plane of the channel layer material is presented at the surface thereof.

Alternatively, it may be preferable to have the highest conductivity plane of the channel layer oriented so that it is not parallel to the insulating gate surface, due to the longer coherence length in the highest conductivity plane. In particular, in one embodiment it is preferable to have the highest conductivity plane both perpendicular to the surface of the insulating gate surface and also parallel to the desired direction of current flow. Since the coherence length in the high conductivity direction is large, increased modulation of the conduction properties of the channel layer may be realized. Reference is made to the earlier discussion of the superconducting coherence length.

Magnetic fields have detrimental effects upon superconducting critical current, and also induce resistive loss below a critical current limit of a superconductor. To reduce the magnetic field generated by current traveling in the channels of the device, the channel layers 12 may be connected so that currents in them travel in antiparallel directions. Therefore, magnetic field generated by current between antiparallel currents in channel layers 12 oppose one another and the net magnetic field is reduced. This effect can also be applied to each channel layer 12 by patterning each channel layer into a meander path having antiparallel directions of current flow.

The gate electrode layers 13 ma also be connected so that the transient gate charging current in various gate electrodes travels in opposite directions in order to reduce associated transient magnetic fields.

The various channel layers and gate layers are not limited to be the same material. Different channel layers may be provided in order to produce various effects, such as multitemperature operation, device integration, multicurrent level response etc.

Figure 9:
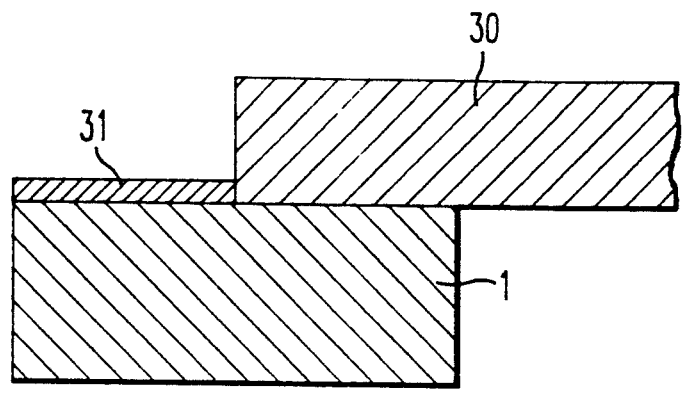
FIG. 9 is a side view of an intermediate structure.

FIGS. 9 through 12 show a method of making an embodiment of this invention corresponding to FIG. 1. The method comprises shadow masking a substrate 1 with a shadow mask 30, and depositing a first epitaxial film of a superconducting material 31, as shown in FIG. 9. The film 31 may also deposit upon shadow mask 30, but such deposition is irrelevant to this fabrication process and is therefore omitted from FIGS. 9 and 10 which show shadow mask 30.

The first epitaxial film 31 should be thick enough so that it can be used as a contact pad. The shadow mask 30 is preferably a material which is resistant to oxidation at high temperatures. $LaAlO_3$ is a suitable material. Also, the shadow mask 30 should be relatively thin so that it does not interfere with heat transfer to and from the substrate 1 during deposition and does not cause edging effects.

Edging effects make the film produced near the edge of a mask different than the film produced far from the mask, and are undesirable. These effects affect thickness, composition, and structure.

Figure 10:
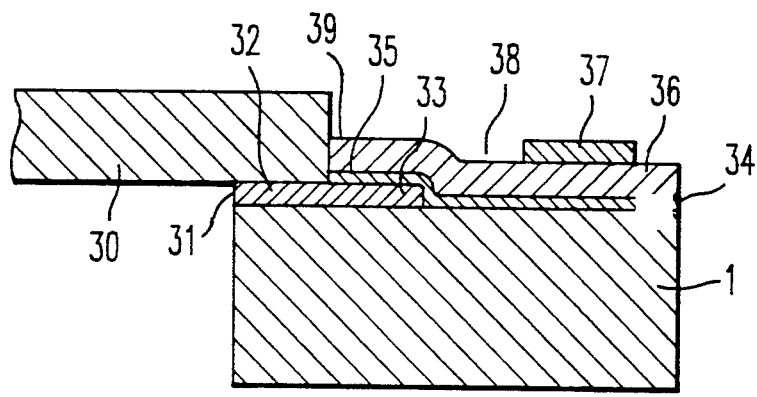
FIG. 10 is a side view of another intermediate structure.

The method shown in FIGS. 9-12 also includes moving the shadow mask 30 to cover a portion 32 of the first epitaxial film 31 and exposing a portion 33 of the first epitaxial film 31 and a region of the substrate adjacent to the first epitaxial thin film 31, and depositing a second epitaxial layer 34 of a superconducting thin film on the exposed substrate surface, the second epitaxial layer 34 having a portion 35 on the exposed portion 33 of the first epitaxial film, as shown in FIG. 10. Thereafter, an insulating layer 36 is deposited on the exposed surfaces of the thick and thin regions. Part 39 of the insulating layer 36 covers that portion 33 of the first epitaxial layer 31 which is uncovered by the shadow mask 30. A portion 38 of insulating film 36 is between the first epitaxial superconductor film 31 and a metal gate electrode 37 which will be described shortly.

The continuous deposition of the thin region, second epitaxial film 34 on the thick region, first epitaxial film 31, provides excellent electrical contact between these regions. Deposition of epitaxial layers 31 and 34 and the deposition of the insulating layer 36 are all performed without breaking vacuum. Once the insulating layer 36 has been deposited the intermediate structure of the invention can be safely removed from vacuum and processed.

The thin and thick regions and the insulating layer may be deposited by laser ablation, sputtering, coevaporation, or any other technique capable of epitaxial deposition of superconducting thin films.

In-situ deposition of the thin and thick regions, and also the insulating layer 36 provides a high quality thin region 3 which also does not degrade with time.

Once the insulating layer 36 is deposited, a metal electrode layer 37 may be deposited using standard lithographic patterning and deposition techniques.

Figure 11:
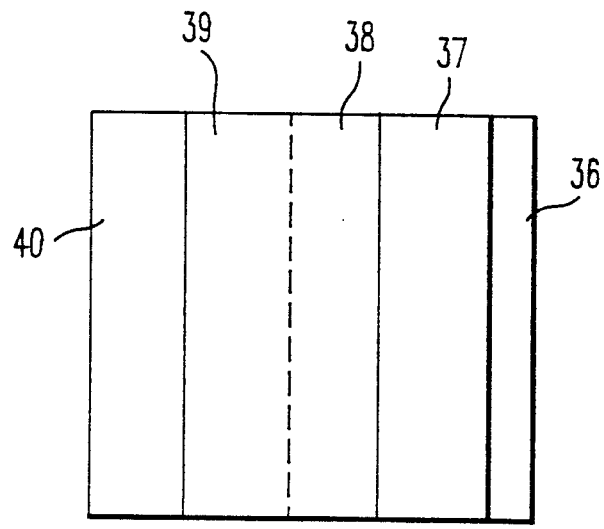
FIG. 11 is a plan view of the structure of FIG. 10.

FIG. 11 presents a plan view of the structure shown in FIG. 10, once the shadow mask 30 is removed. Element 40 shows the surface of the exposed portion of the thicker first epitaxial film 31, element 39 shows the surface of that portion of the insulating layer which covers the overlapped portions of first and second epitaxial superconducting films 31 and 34, element 38 shows the surface of the insulating layer 36 which covers the second thin epitaxial superconducting film 34 which is between the first epitaxial film 31 and the metal electrode 37. 36a represents a portion of the insulating layer adjacent to a side of the metal electrode layer 37 which is further from the region 38.

Figure 12:
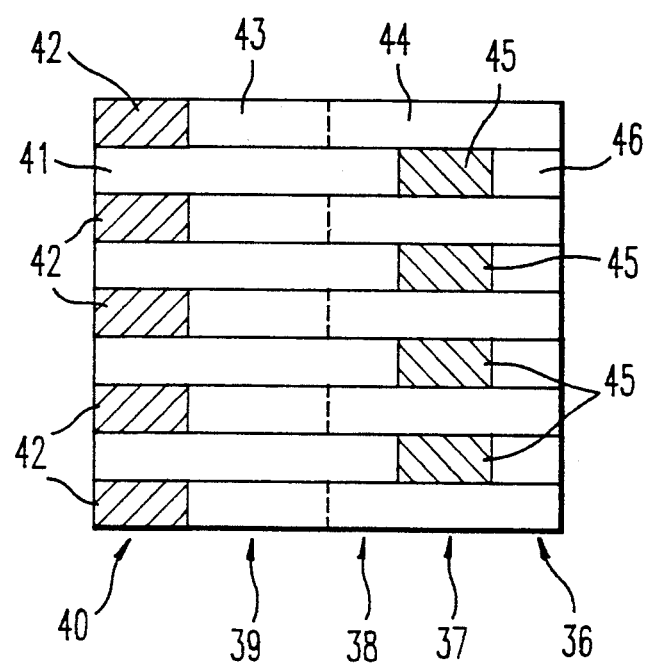
FIG. 12 is a plan view of a structure corresponding to FIG. 11.

The structure of FIG. 11 is lithographically patterned by standard techniques to provide the structure shown in FIG. 12. Elements 3a and 37–40 and the arrows associated therewith in FIG. 12 indicate corresponding regions with FIG. 11. In regions 41 the substrate is now exposed and electrically isolates contact pads 42 consisting of material from the first epitaxial film of superconductor 31, from one another. In region 43 a portions of thick and thin overlapped epitaxial superconducting layers 31 and 34 are covered by a portion of insulating layer 36 and in region 44 a portion of thin epitaxial superconducting film 34 is covered by a portion insulating film 36. Gate region 45 has portions of gate electrode layer 37 over a portions of insulating film 36 which in turn cover channel regions of thin superconducting film 34. Region 46 of the substrate is also exposed.

Alternatively to shadow masking the substrate before deposition of the first epitaxial region, a thin epitaxial layer of superconductor may be initially deposited and followed by shadow masking a portion of this thin epitaxial layer and then depositing a thicker epitaxial layer on exposed regions of the substrate. This alternative process will provide a structure with layers similar to substrate 1, thin layer 34, and thick layer 31 shown in FIG. 10, except that thin layer 34 will extend underneath layer 31. Since the overlap portions of layers 31 and 34 are epitaxial and may be the same material there really is no distinction of these layers in the overlapped region. Processing using this alternative method proceeds after deposition of the two superconducting layers, as discussed above.

Figure 13:
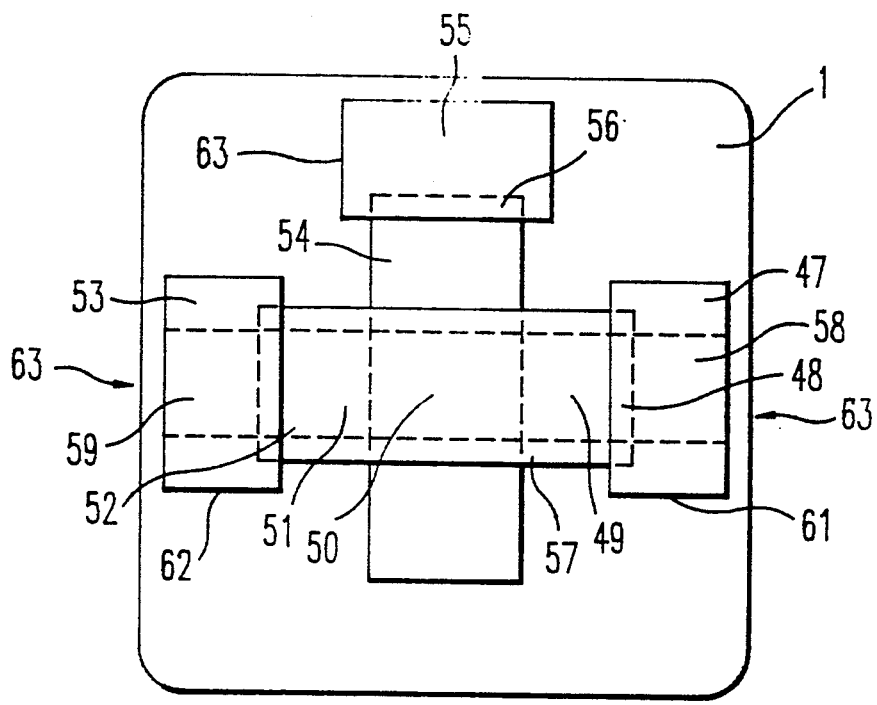
FIG. 13 is a plan view of a interleaved structure.
Figure 14:
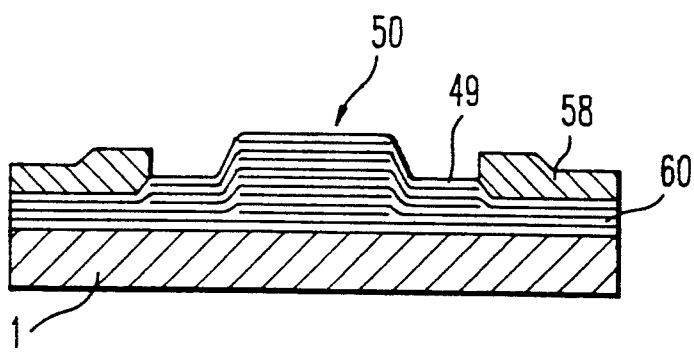
FIG. 14 is a sectional side view of the structure of FIG. 13 for parallel channels.
Figure 15:
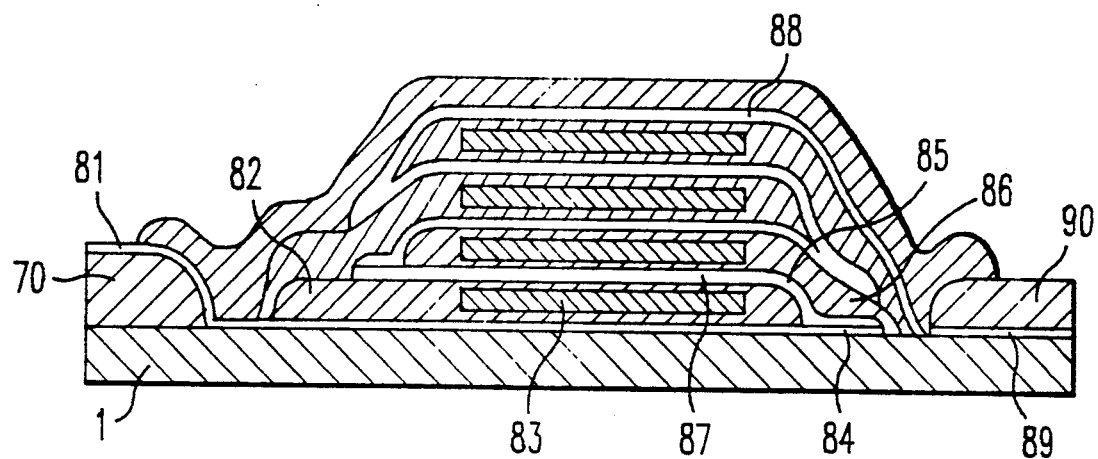
FIG. 15 is a sectional side view of an interleaved structure with series connected channels.
Figure 16:
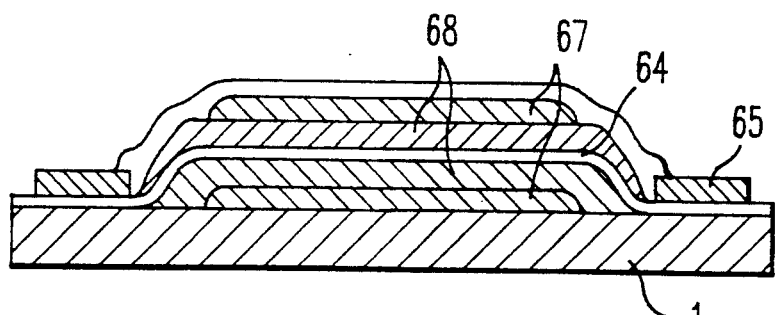
FIG. 16 is a sectional side view of an interleaved structure for parallel channels.

Next, methods of fabricating the interleaved structure will be presented with reference to FIGS. 13, 14 and 16 for an interleaved structure with channels in parallel and with reference to FIGS. 13 and 15 for an interleaved structure with channels in series.

FIG. 13 shows a plan view of an interleaved structure according to the invention where channel layer contact pads 61 and 62, contain regions 47, 48 and 58, and corresponding regions 53, 52 and 59, respectively. Dashed lines of FIG. 13 indicate an area inside which the channel layers exist. In regions 58 and 59 the channel layers and the contact pads overlap and provide low resistance electrical connection to the thin channel layers in region 50. In regions 47 and 53 only the contact pads are on the substrate. In regions 48 and 52 only the insulating gate layers and the channel layers are interleaved and are either on top of, underneath, or inside the contact pad layer. In regions 49 and 51 only the channel layers and insulating layers are interleaved on the substrate 1. Region 57 is a peripheral side region of the insulating layers which is outside of the dashed lines representing regions where the channel layer exists. Region 57 has only the insulating layers upon the substrate. The gate electrodes and channel layers are interleaved with the insulating layers in central region 50 to form the interleaved structure corresponding to layers 12-14 shown in FIG. 6. The gate electrodes extend across region 54 to gate electrode contact pad 55 at overlap region 56.

FIG. 14 shows a cross sectional side view of a parallel channel structure of the invention along the line 63—63 of FIG. 13. This structure shows the contact pad and channel layer overlap region 60, the insulator and channel layer overlap region 49 and the interleaved central region 50.

FIG. 16 shows a simplified and enlarged version of the parallel channel device shown in FIG. 14. FIG. 16 is simplified in that it only has one channel layer.

A method of making the parallel channel structure shown in FIG. 16 comprises depositing gate layer 67 on a substrate 1. The gate layer extends into the page of the Figure to a gate contact pad 55, as shown in FIG. 13. An insulating layer 68 is deposited on the gate electrode 67 and a channel layer 64 is deposited over the insulator and portions of regions where contact pads 65 will be deposited. Another insulating layer 68 is deposited over the central region of overlap of the gate electrode and channel layer. Another gate electrode 67 is deposited over the same place as the first gate electrode so that it does not contact the channel layer.

A complete single channel, channel layer 64, and double gate, gate layers 67, 67, structure has been prepared. The foregoing steps may be repeated as a unit in order to provide a structure with multiple channels and multiple gates as shown in FIG. 14. Whether a single channel or multiple parallel channel structure is prepared a final passivating layer 69 may be deposited in order to encapsulate and protect all of the channel layers as shown in FIG. 16.

A method of making the series channel structure of FIG. 7 is similar, and is illustrated with reference to FIG. 15. This method requires connecting a series of vertically stacked channel layers so that current weaves back and forth as it travels through the channel layers of the interleaved stack, as shown in FIG. 15. The channel series structure can be made by first forming a first contact pad 70 on the substrate 1, depositing a first channel film 81 on the contact pad 70 and part of the substrate 1. This may be done by shadow masking in situ.

The first channel layer 81 is covered by depositing an insulating layer 82 containing a gate electrode 83. This may be accomplished by shadow masking and first depositing a portion of the insulating layer 82 then depositing a gate electrode with another shadow mask and finally depositing the rest of the insulating layer. The insulating layer 82 does not cover an extended portion 84 of the first channel layer 82. A second channel layer 85 is then deposited over a portion of the insulating layer 82 and over the exposed portion 84 of the first channel layer 81 to connect thereto. The extended portion 84 and the region 87 in the gate region are then covered by depositing a second insulating layer 86 which also has a gate electrode contained therein. Deposition of interleaved layers is continued until a desired number of channels have been deposited. The uppermost channel layer 88 is extended by depositing layer 88 over a second channel contact region 89 and a second contact is prepared by depositing a thick contact pad 90 over region 89.

The edges of layers to be deposited can be rounded by moving the shadow mask a distance from the substrate, moving the orientation of the deposition source relative to the substrate during deposition, or moving the shadow mask during deposition. Rounding of the edges of the layers may provide less steep surfaces and this will promote continuity of subsequently deposited layers.

The contact pad films may be epitaxial and of the same, similar superconductor as a channel layer. Finally, the structure is protected by depositing a passivating layer over exposed portions of the thin channel layers. After the passivating layer is deposited the structure is protected and standard photolithographic and other processing may be accomplished.

Preferably vacuum is not broken until all the thin superconducting channel layers have been deposited.

Figure 17:
FIG. 17 is a TEM photograph of a multilayer of $SrTiO_3$ and $YBa_2Cu_3O_7$ on $SrTiO_3$.

FIG. 17 is a TEM photograph showing a $YBa_2Cu_3O_7$ film epitaxial with and connected on both sides by $SrTiO_3$.

Figure 18:
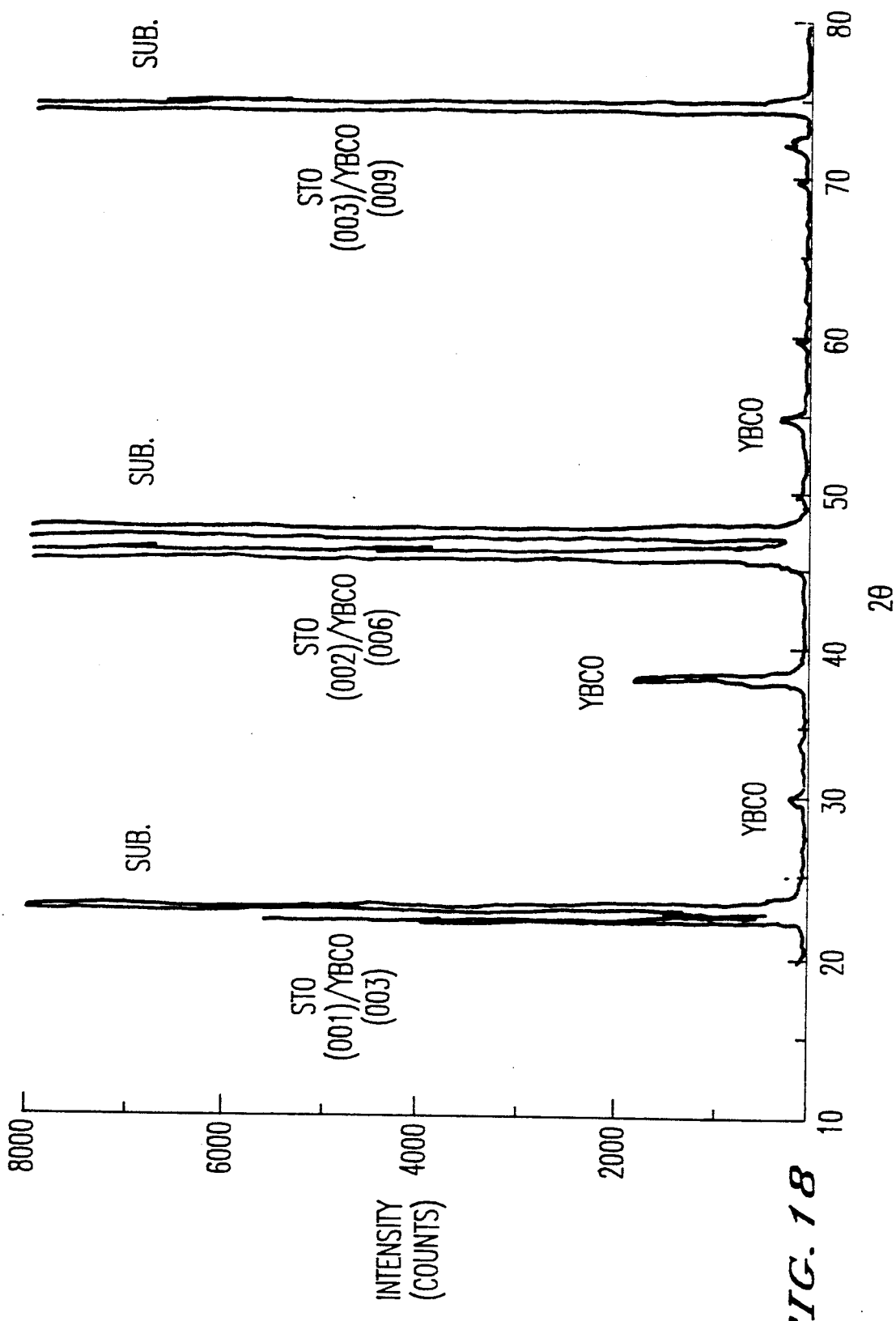
FIG. 18 is a theta-two theta scan of the thin film of FIG. 18.
Figure 19:
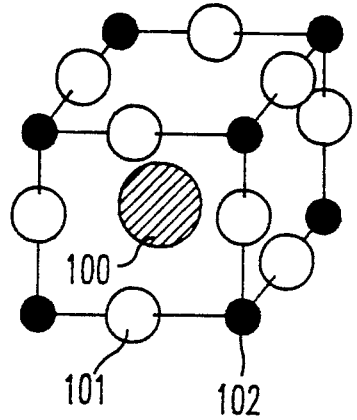
FIG. 19 is a unit cell of an undistorted perovskite structure.
Figure 20:
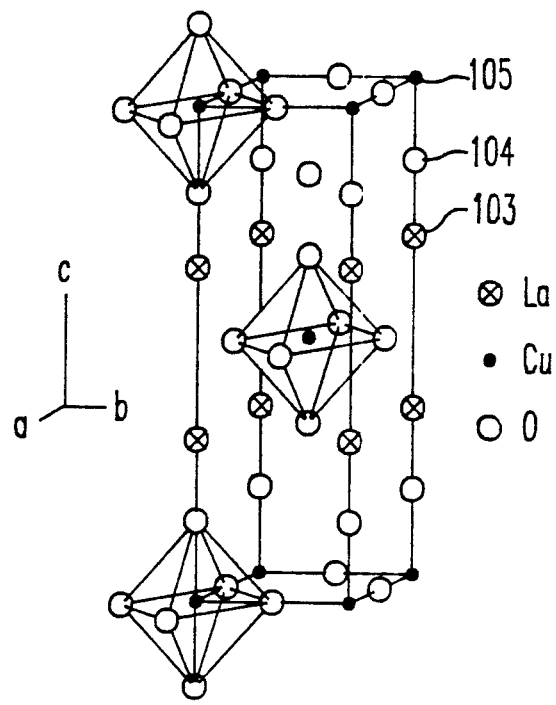
FIG. 20 is an illustration of the $La_2CuO_4$ structure.
Figure 21:
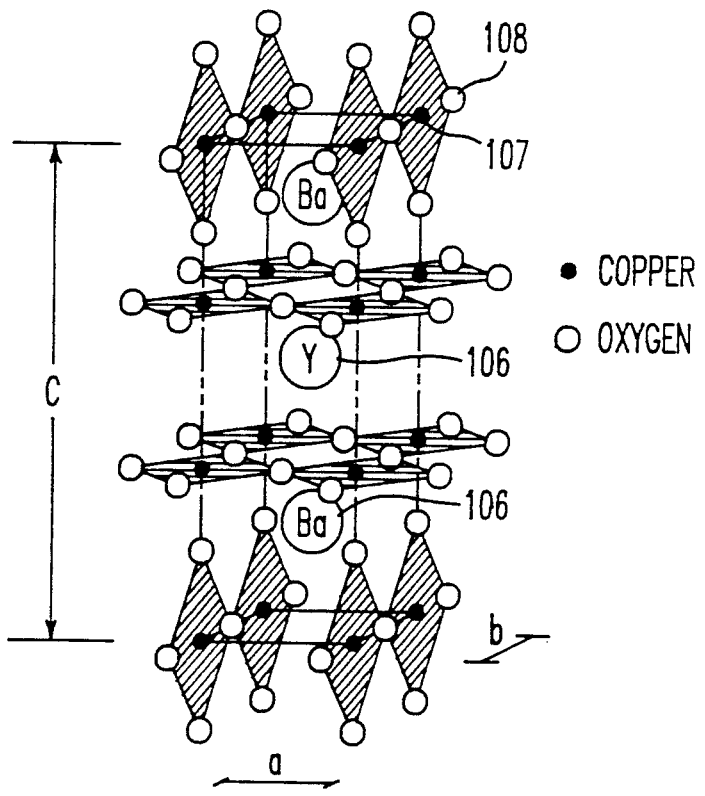
FIG. 21 is an illustration of the YBCO structure.
Figure 22A:
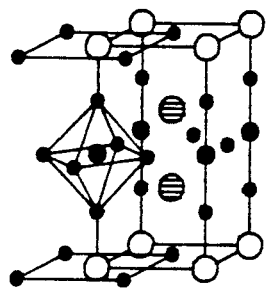
FIG. 22a-f is an illustration of various layered structures corresponding to TBCCO and BSCCO metal-oxide superconductor compounds.
Figure 22B:
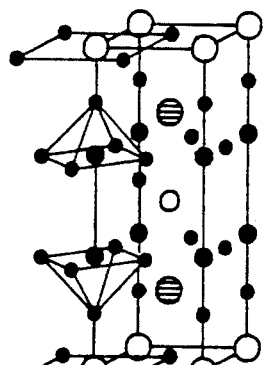
Figure 22C:
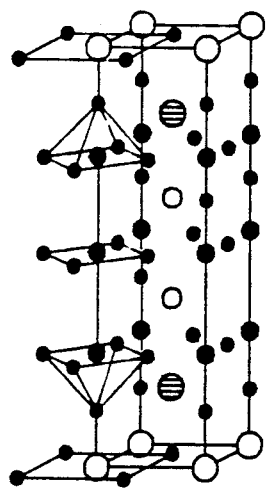
Figure 22D:
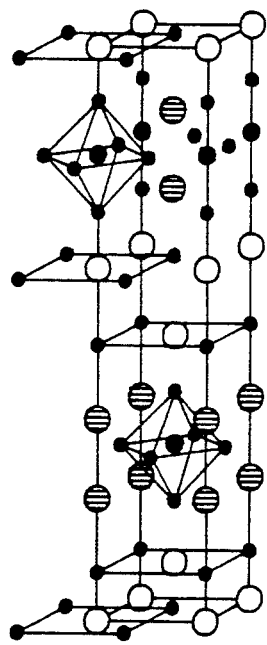
Figure 22E:
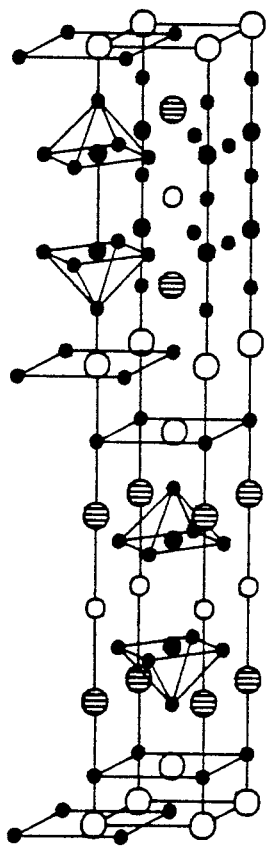
Figure 22F:
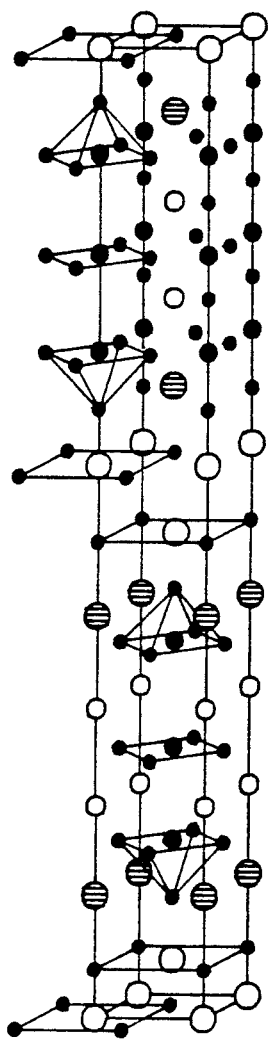
Figure 23:
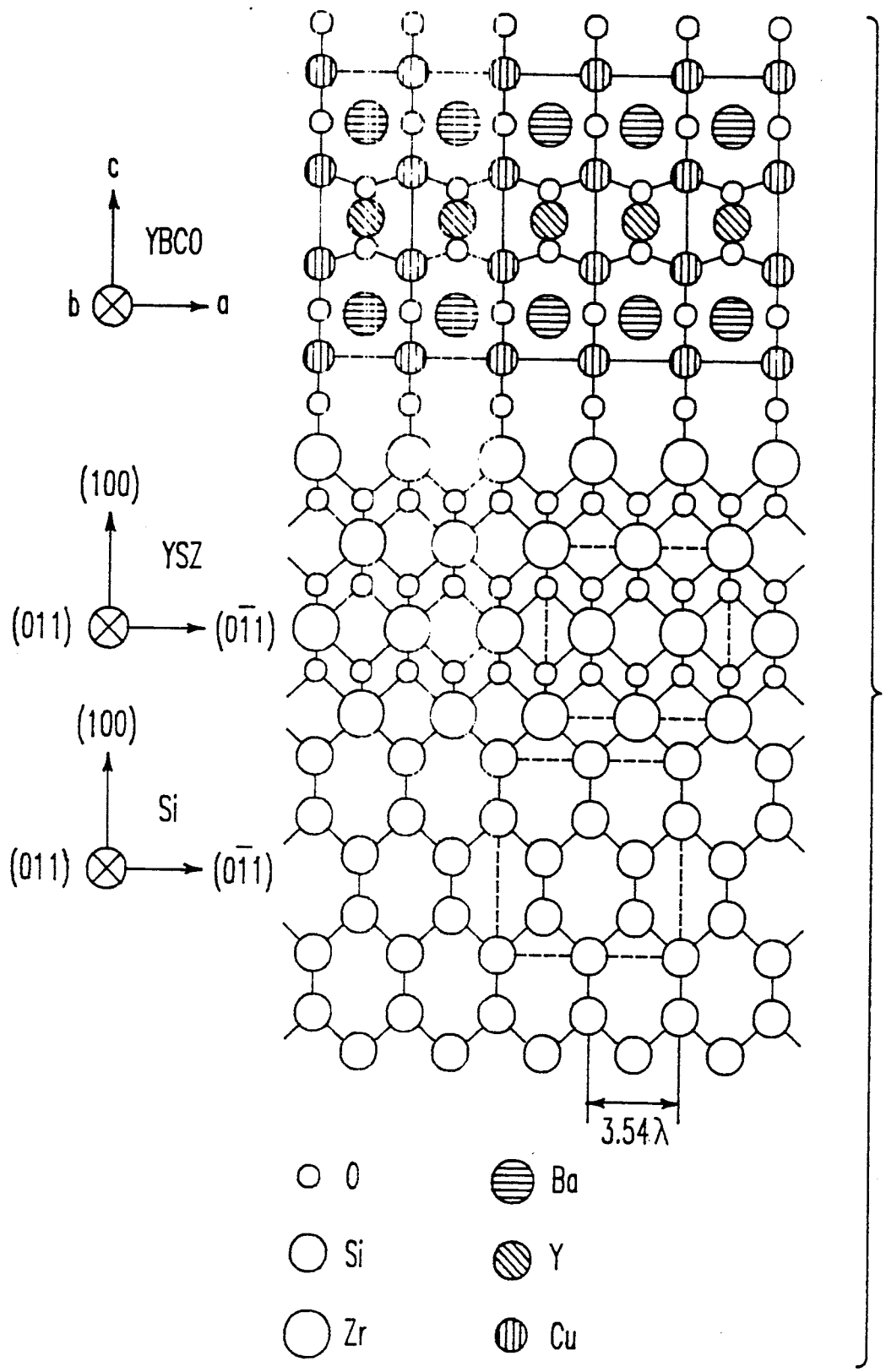
FIG. 23 is an illustration of a possible epitaxial arrangement of YBCO on Yittria stabilized zirconia on Silicon.

FIG. 18 is a theta - two theta X-ray scan of the film shown in FIG. 17. Presence of only the (00L) peaks in this scan indicates that both the $YBa_2Cu_3O_7$ and $SrTiO_3$ layers are epitaxial on the substrate.

The present invention provides a method for modulating current which provides low loss during modulation and is superconducting and therefore nearly lossless in the conduction state. High current low loss switches of this type are particularly useful in electric motors and generators and in Superconducting Magnetic Energy Storage Devices (SMES). Both electric motors and generators operate in the same manner and require the same type of switching.

The invention also enables extremely high speed modulation since the metal-oxide superconductors are capable of operation in the gigahertz range. Such switches and modulators are particularly useful in very high speed computing, in high frequency sources, detectors and mixers.

The invention can not only provide switching but also linearly control the output by a gate signal. In this sense the invention can be used analogously to an electronic valve device.

Several other ferroelectric materials are good candidates for a ferroelectric gate layer because of their compatibility with metal-oxide superconductors, their lattice matching capability to metal-oxide superconductors, including $ABO_3$ chemical formula compounds $(PbSrLaBiBa)(ZrTi)O_3$ and $(SrCaBaLiKPbTa)(NbMg)O_3$ where all the elements listed within a perenthesis, ( ), in accordance with standard convention, indicate elements which can be traded off with one another on a particular sub-lattice site of a corresponding crystal structure.

The substrate may also include sapphire, flourides, $CeO_2$, $MgO$, $NdGaO_3$, $PrBa_2Cu_3O_{7-x}$ where x is between 0 and 1, nonsuperconducting $(YPr)Ba_2Cu_3O_{7-x}$ where x is between 0 and 1, and nonsuperconducting $YBa_2Cu_3O_{7-x}$ where x is between 0 and 1.

Additional other metal-oxide superconductors that are useful in this invention due to their superconducting properties and compatibility with other materials include YBCO where Ba is substituted at least in part by Sr or Ca, and Cu is substituted at least in part by any 3d transition metal element including Zn, and also Cd.

Preparation of the channel layers and the gate electrode in situ provides high quality thin layers of superconductor which do not degrade with time.

The superconducting layers of the invention can be any metal-oxide superconductors, and particularly can be Cu-0 and Bi-O based superconductors.

Obviously, numerous modifications and variations of the present invention are possible in light of the above teachings. It is therefore to be understood that within the scope of the appended claims, the invention may be practiced otherwise then as specifically described.

What is claimed as new and desired to be secured by Letters Patent of the United States is:

1. A superconducting device, comprising:
   a substrate; and
   a film of a superconducting material above the substrate and having a lower surface epitaxially connected thereto, the film having a thick region and a thin region which is thinner than said thick region, wherein the thin region has a thickness less than 20 times the coherence length of bulk material which comprises the same material as the superconducting film.

2. A device according to claim 1, wherein:
   said thin region has a thickness which is less than 15 times the coherence length of a bulk material which comprises the same material as the superconducting film.

3. A device according to claim 1, wherein:
   said thin region has a thickness which is less than 3 times the coherence length of a bulk material of the same material as the superconducting film.

4. A device according to claim 1, wherein:
   a thickness of the thin region is less than 200 angstroms.

5. A device according to claim 1, wherein:
   a thickness of the thin region is less than 50 angstroms.

6. A device according to claim 1, wherein:
   a thickness of the thin region is less than 10 angstroms.

7. A device according to claim 1, wherein:
   a thickness of the thick region is thick enough so that conventional ohmic contacts can be prepared thereon.

8. A device according to claim 1, wherein:
   a thickness of the thick region is at least 300 angstroms thick.

9. A device according to claim 1, further comprising:
   a buffer layer between and epitaxially contacted to both the thin region and the substrate.

10. A device according to claim 9, wherein:
    the buffer layer comprises at least one of the member of the group consisting of $CeO_2$, $MgO$, nonsuperconducting $YBa_2Cu_3O_{7-x}$ where x is between 0 and 1, nonsuperconducting $(YPr)Ba_2Cu_3O_{7-x}$ where x is between 0 and 1, $PrBa_2Cu_3O_{7-x}$ where x is between 0 and 1, and $NdGaO_3$.

11. A device according to claim 9, wherein:
    the buffer layer comprises doped $SrTiO_3$ which is doped so that it is semiconducting.

12. A device according to claim 1, wherein:
    the substrate comprises $SrTiO_3$.

13. A device according to claim 1, wherein:
    the substrate comprises semiconducting doped $SrTiO_3$.

14. A device according to claim 1, wherein:

the substrate comprises one of Si and GaAs, sapphire, fluorides, $CeO_2$, MgO, $NdGaO_3$, $PrBaCuO_{7-x}$ where x is between 0 and 1, nonsuperconducting $YBa_2Cu_3O_{7-x}$ where x is between 0 and 1 and nonsuperconducting $(YPr)Ba_2Cu_3O_{7-x}$ where x is between 0 and 1.

15. A device structure to claim 1, wherein:
the thin region comprises a metal-oxide superconductor.

16. A device according to claim 15, wherein:
the metal-oxide superconductor is $YBa_2Cu_3O_{7-x}$ where x between 0 and 1.

17. A device according to claim 1, wherein:
the thin region comprises $Pr_{1-x}Y_xBa_2Cu_3O_{7-y}$ for values of x and y that provide superconducting $Pr_{1-x}Y_xBa_2Cu_3O_{7-y}$.

18. A device according to claim 15, wherein:
the metal-oxide superconductor is selected from a member of the group consisting of superconducting compounds that comprise elements from one of the following sets: the set consisting of Y R1 R2 O where R1 is at least one element selected from the set consisting of Ba, Sr and Ca, and R2 is at least one element selected from the set consisting of Sc, Ti, V, Cr, Mn, Fe, Co, Ni, Cu, and Cd, and the sets of Tl Ba Ca Cu O, Bi Sr Ca Cu O, Bi Pb Sr Ca Cu O, Bi K Cu O, La Sr Cu O, Cu O, Bi O, Ba K Bi O, and Ce Sr Cu O.

19. A device according to claim 1, further comprising:
a high mobility layer between the epitaxially connected to the substrate and the thin film of superconducting material wherein the mobility of the high mobility layer at room temperature is at least 500 square centimeters per volt-second.

20. A device according to claim 19, wherein:
the high mobility layer has strong proximity coupling to the thin region which is strong enough to increase a coherence length of the film of superconducting material.

21. A device according to claim 19, wherein:
the high mobility layer comprises one of doped semiconducting $SrTiO_3$, Si and GaAs.

22. A device according to claim 1, wherein:
the substrate comprises one of Si and GaAs; and further comprising at least first and second buffer layers disposed between the substrate and the film of superconducting material, the first buffer layer having a lower surface epitaxially contacted to the silicon substrate and the second buffer layer having a second surface epitaxially contacted to the film of the superconducting material.

23. A device according to claim 1, further comprising:
a passivating layer covering an upper surface of the thin region.

24. A device according to claim 23, wherein:
the passivating layer comprises an insulating layer.

25. A device according to claim 23, wherein:
the passivating layer is epitaxially contacted to the film of the thin region.

26. A device according to claim 23, wherein:
the passivating layer comprises a perovskite type structure material.

27. A device according to claim 1, further comprising:
a ferroelectric layer covering an upper surface of the thin region.

28. A device according to claim 27, wherein:
the ferroelectric layer comprises at least one member selected from the group consisting of PLZT, PZT, (PbSrLaBaBi) $(ZrTi)O_3$, (SrCaBaLiKPbTa) $(NbMg)O_3$ and $(PbBaSr)TiO_3$.

29. A device according to claim 23, wherein:
the passivating layer also covers a portion of the thicker region.

30. A device according to claim 23, wherein:
the passivating layer comprises a pyroelectric layer.

31. A device according to claim 1, further comprising:
a gate electrode opposed to the thin region.

32. A superconducting device, comprising:
a first unit including a thin film of a superconducting material with an upper and a lower surface which forms a channel layer;
an upper surface of a lower insulating gate layer epitaxially connected to the lower surface of the superconducting film and a lower surface of an upper insulating gate layer epitaxially connected to the upper surface of the superconducting film;
a lower gate electrode below the lower insulating gate;
an upper gate electrode above the upper insulating gate layer and;
wherein the thickness of the thin film is less than 20 times the coherence length of a bulk material of the same material as the thin film.

33. A device according to claim 32, wherein: the gate electrode material is identical to the superconducting material of the thin film.

34. A device according to claim 32, wherein:
all the layers of each unit are epitaxially connected to one another.

35. A device according to claim 32, wherein:
a thickness of the channel layer is less than 150 angstroms.

36. A device according to claim 32, wherein:
a gate electrode thickness is greater than 50 angstroms.

37. A device according to claim 32, wherein:
a gate electrode thickness is less than 1000 angstroms.

38. A device according to claim 32, wherein:
the channel layer comprises a metal-oxide superconductor.

39. A device according to claim 32, wherein:
each gate layer comprises at least one material selected from the group consisting of $CeO_2$, MgO, nonsuperconducting $YBaCuO_{7-x}$ where x is between 0 and 1, nonsuperconducting $(YPr)Ba_2Cu_3O_{7-x}$ where x is between 0 and 1, $PrBa_2Cu_3O_{7-x}$ where x is between 0 and 1, $SrTiO_3$, $BaTiO_3$, $LaAlO_3$, $NdGaO_3$, PLZT, PZT, (PbSrLaBaBi) $(ZrTi)O_3$, (SrCaBaLiKPbTa) $(NbMg)O_3$ and $(PbBaSr)TiO_3$.

40. A device according to claim 32, wherein:
a gate electrode comprises a material which lattice matches to the adjacent gate layer.

41. A device according to claim 32, wherein:
a gate electrode comprises a metal-oxide superconductor.

42. A device according to claim 32, wherein:
the channel layer and the gate electrode layer comprise elements from the group consisting of; Cu and O, and Bi and O.

43. A device according to claim 32, further comprising:

units which are identical to the first unit and which are stacked upon one another so that the lower gate electrode of an upper unit is an upper gate electrode of an adjacent lower unit.

44. A device according to claim 43, further comprising:
first electrical connecting means for electrically connecting at least two channel layers in parallel.

45. A device according to claim 43, further comprising:
second electrical connection means for connecting at least two channel layers in series.

46. A device according to claim 43, further comprising:
third electrical connecting means for electrically connecting at least two gate electrodes to a common voltage source, and wherein gate layers and channel layers form multilayers.

47. A device according to claim 43, wherein:
all the layers are epitaxially contacted to the layers to which they are adjacent.

48. A device according to claim 44, wherein:
said first electrical connecting means includes magnetic field reducing means for reducing magnetic fields generated in the structure by current flowing along the channels, by defining and electrically contacting the channels so that a direction of current in at least one of various portions of channels and in various channel layers is opposite, thereby producing from at least one of said various portions and said various channels, opposing magnetic fields which partially cancel.

49. A device according to claim 43, further comprising:
a source and drain means, for conducting current in the channel layers; and
wherein a channel layer is patterned to have an increased ratio of channel path length between the source and drain means to channel layer cross sectional, thereby increasing a resistance of said channel layer.

50. A device according to claim 32, wherein: the channel layer and the gate electrode layer comprise elements from the group consisting of; Tl Ba Ca Cu O, Bi Sr Ca Cu O, Bi Pb Sr Ca Cu O, Bi K Cu O, La Sr Cu O, Ba K Bi O, Ce Sr Cu O, and Y R1 R2 O where R1 is at least one element selected from the set consisting of Ba, Sr and Ca, and R2 is at least one element selected from the set consisting of Sc, Ti, V, Cr, Mn, Fe, Co, Ni, Cu, and Cd.

* * * * *